United States Patent
Park et al.

(10) Patent No.: US 10,318,187 B2
(45) Date of Patent: Jun. 11, 2019

(54) MEMORY CONTROLLER AND MEMORY SYSTEM INCLUDING THE SAME

(71) Applicant: SK hynix Inc., Gyeonggi-do (KR)

(72) Inventors: Il Park, Gyeonggi-do (KR); Sang-Jin Byeon, Gyeonggi-do (KR); Taek-Sang Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/234,912

(22) Filed: Aug. 11, 2016

(65) Prior Publication Data
US 2018/0046389 A1   Feb. 15, 2018

(51) Int. Cl.
*G06F 3/06* (2006.01)
*G11C 11/406* (2006.01)
*G06F 13/16* (2006.01)

(52) U.S. Cl.
CPC .......... *G06F 3/0619* (2013.01); *G06F 3/0659* (2013.01); *G06F 3/0683* (2013.01); *G06F 13/1689* (2013.01); *G11C 11/40611* (2013.01); *G11C 11/40618* (2013.01); *G06F 13/1636* (2013.01); *Y02D 10/14* (2018.01)

(58) Field of Classification Search
USPC ........................................................ 711/154
See application file for complete search history.

(56) References Cited

U.S. PATENT DOCUMENTS

| | | | | |
|---|---|---|---|---|
| 6,553,449 B1* | 4/2003 | Dodd | .................. | G06F 13/1684 711/5 |
| 6,763,443 B1* | 7/2004 | Clark | .................. | G06F 13/1689 365/222 |
| 9,269,417 B2* | 2/2016 | Crawford | .......... | G11C 11/40611 |
| 2002/0065981 A1* | 5/2002 | Jenne | .................... | G06F 13/161 711/105 |
| 2003/0007406 A1* | 1/2003 | Kyung | .................. | G11C 11/406 365/222 |
| 2004/0123036 A1* | 6/2004 | Hammitt | ............. | G06F 13/1684 711/131 |
| 2005/0135171 A1* | 6/2005 | Kim | ...................... | G11C 11/406 365/222 |
| 2007/0022245 A1* | 1/2007 | Sohn | ................... | G06F 13/1636 711/106 |
| 2009/0116326 A1* | 5/2009 | Lee | ........................ | G11C 11/406 365/222 |
| 2012/0099389 A1* | 4/2012 | Park | .................. | G11C 11/40618 365/200 |
| 2012/0144106 A1* | 6/2012 | Bains | ................ | G11C 11/40611 711/106 |

(Continued)

FOREIGN PATENT DOCUMENTS

KR   100809960   3/2008

*Primary Examiner* — Mano Padmanabhan
*Assistant Examiner* — Jean C Edouard
(74) *Attorney, Agent, or Firm* — IP & T Group LLP (57) ABSTRACT

A memory system includes: a memory device including a plurality of memory banks; and a memory controller suitable for monitoring a workload of the memory device and applying one of a first refresh command and a second refresh command to the memory device according to a result of the monitoring. In the memory device, the number of memory banks to be refreshed by the second refresh command may be greater than the number of memory banks to be refreshed by the first refresh command.

14 Claims, 3 Drawing Sheets

(56) References Cited

U.S. PATENT DOCUMENTS

| | | | |
|---|---|---|---|
| 2012/0151131 A1* | 6/2012 | Kilmer | G11C 11/406 |
| | | | 711/106 |
| 2013/0044535 A1* | 2/2013 | Shimakawa | G11C 13/004 |
| | | | 365/148 |
| 2013/0128682 A1* | 5/2013 | Henderson | G11C 11/40611 |
| | | | 365/222 |
| 2013/0279283 A1* | 10/2013 | Seo | G11C 7/00 |
| | | | 365/222 |
| 2013/0282973 A1* | 10/2013 | Kim | G11C 11/40622 |
| | | | 711/106 |
| 2014/0059287 A1* | 2/2014 | Bains | G11C 11/40615 |
| | | | 711/106 |
| 2014/0095780 A1* | 4/2014 | Bains | G11C 11/406 |
| | | | 711/105 |
| 2014/0211579 A1* | 7/2014 | Lovelace | G11C 11/40607 |
| | | | 365/200 |
| 2014/0281202 A1* | 9/2014 | Hunter | G11C 11/40611 |
| | | | 711/106 |
| 2015/0092508 A1* | 4/2015 | Bains | G11C 11/40611 |
| | | | 365/222 |
| 2015/0127899 A1* | 5/2015 | Cordero | G11C 11/40603 |
| | | | 711/106 |
| 2015/0206574 A1* | 7/2015 | Greathouse | G06F 13/1636 |
| | | | 711/103 |
| 2015/0347036 A1* | 12/2015 | Hunter | G11C 11/40611 |
| | | | 711/106 |
| 2017/0213314 A1* | 7/2017 | Barstow | G06T 1/60 |

\* cited by examiner

| FIRST HOSTS | | SECOND HOSTS | | |
|---|---|---|---|---|
| CPU | GPU | COMMUNICATION UNIT | DISPLAY CONTROLLER | VIDEO CODEC |
| 2500 | 1200 | 3500 | 2200 | 5000 |
| FIRST HOSTS : 3700 | | SECOND HOSTS : 10700 | | |
| ENTIRE HOSTS : 14400 | | | | |

(B)

| FIRST HOSTS | | SECOND HOSTS | | |
|---|---|---|---|---|
| CPU | GPU | COMMUNICATION UNIT | DISPLAY CONTROLLER | VIDEO CODEC |
| 4000 | 2200 | 1000 | 700 | 300 |
| FIRST HOSTS : 6200 | | SECOND HOSTS : 2000 | | |
| ENTIRE HOSTS : 8200 | | | | |

(C)

| FIRST HOSTS | | SECOND HOSTS | | |
|---|---|---|---|---|
| CPU | GPU | COMMUNICATION UNIT | DISPLAY CONTROLLER | VIDEO CODEC |
| 2300 | 3100 | 3000 | 1500 | 1300 |
| FIRST HOSTS : 5400 | | SECOND HOSTS : 5800 | | |
| ENTIRE HOSTS : 11200 | | | | |

MEMORY CONTROLLER AND MEMORY SYSTEM INCLUDING THE SAME

TECHNICAL FIELD

Exemplary embodiments of the invention relate generally to a memory controller and a memory system including the same.

DISCUSSION OF THE RELATED ART

A memory cell of a memory device includes a capacitor for storing charges and a transistor functioning as a switch controlling the flow of charges to and from the capacitor. The stored charges in the capacitor represent data. For example, when charges are present in the capacitor, the voltage across the leads of the capacitor is high and may represent a 'high' (logic 1) data. When charges are not present in the capacitor, the voltage across the leads of the capacitor is low and may represent a 'low' (logic 0) data. Since storage of data is embodied in such a way that charges are accumulated in the capacitor, in principle, there is no power consumption. However, because there is leakage current due to PN coupling or the like of a MOS transistor, an initial amount of charges stored in the capacitor is reduced, and thus data may be lost. To prevent this, data in the memory cell is read before data is lost, and charges are recharged to a normal charge amount in accordance with the read information. Such operation is known as a refresh operation and is repeated periodically for retaining the stored data.

A refresh operation is required for maintaining the integrity of the stored data in memory cells employing a capacitor, such as in a DRAM memory device. However, a refresh operation may increase the overall current consumption of the memory device. Performance of the memory device may also be reduced as a result of the refresh operation. Therefore, an improved technology for optimizing a refresh operation for reducing current consumption and improving the performance of memory devices is highly desirable.

SUMMARY

Various embodiments are directed to a technology which reduces current consumption due to a refresh operation of a memory system without a reduction in the performance of the memory system.

In an embodiment, a memory system may include: a memory device including a plurality of memory banks; and a memory controller suitable for monitoring a workload of the memory device and applying one of a first refresh command and a second refresh command to the memory device according to a result of the monitoring, wherein, in the memory device, the number of memory banks to be refreshed by the second refresh command may be greater than the number of memory banks to be refreshed by the first refresh command.

In the case where the workload is high, the memory controller may apply the first refresh command to the memory device, and in the case where the workload is low, the memory controller may apply the second refresh command to the memory device.

In the memory device, the number of memory banks to be refreshed by the first refresh command may be one. In the memory device, memory banks to be refreshed by the second refresh command may be entire memory banks of the memory device.

The memory controller may include: a host interface suitable for communicating with one or more hosts; a workload monitoring unit suitable for monitoring the workload of the memory device; a scheduler suitable for determining an operating sequence of the memory device; a command generator suitable for generating a command to be applied to the memory device; and a memory interface suitable for communicating with the memory device.

The workload monitoring unit may count the number of times of requests from the one or more hosts and determine the workload of the memory device using a result of the counting.

The one or more hosts may be classified into first hosts that regard memory performance relatively as important, and second hosts that do not regard the memory performance relatively as important. If a ratio of [the number of requests from the first hosts]:[the number of requests from the second hosts] for a predetermined time is a second threshold value or more, the workload monitoring unit may determine that the workload is high, and, otherwise, the workload monitoring unit may determine that the workload is low.

The one or more hosts may be classified into first hosts that regard memory performance relatively as important, and second hosts that do not regard the memory performance relatively as important. If the number of requests from the first hosts for a predetermined time is a third threshold value or more, the workload monitoring unit may determine that the workload is high, and, otherwise, the workload monitoring unit may determine that the workload is low.

The first hosts may include at least one or more of a CPU (Central Processing Unit) and a GPU (Graphic Processing Unit), and the second hosts may include at least one or more of a communication unit, a display controller and a video codec.

In an embodiment, a memory controller may include: a host interface suitable for communicating with one or more hosts; a workload monitoring unit suitable for monitoring a workload of a memory device; a scheduler suitable for determining an operating sequence of the memory device; a command generator suitable for generating a command to be applied to the memory device, wherein the command generator generates one of a first refresh command and a second refresh command depending on the workload monitored by the workload monitoring unit; and a memory interface suitable for communicating with the memory device, wherein, in the memory device, the number of memory banks to be refreshed by the second refresh command may be greater than the number of memory banks to be refreshed by the first refresh command.

In the case where the workload is high, the command generator may generate the first refresh command, and in the case where the workload is low, the command generator may generate the second refresh command.

In the memory device, the number of memory banks to be refreshed by the first refresh command may be one. In the memory device, memory banks to be refreshed by the second refresh command may be entire memory banks of the memory device.

The workload monitoring unit may count the number of times of requests from the one or more hosts and determine the workload of the memory device using a result of the counting.

If the total number of requests for a predetermined time is a first threshold value or more, the workload monitoring unit determines that the workload may be high, and, otherwise, the workload monitoring unit determines that the workload may be low.

The one or more hosts may be classified into first hosts that regard memory performance relatively as important, and second hosts that do not regard the memory performance relatively as important. If a ratio of [the number of requests from the first hosts]:[the number of requests from the second hosts] for a predetermined time is a second threshold value or more, the workload monitoring unit may determine that the workload is high, and, otherwise, the workload monitoring unit may determine that the workload is low.

The one or more hosts may be classified into first hosts that regard memory performance relatively as important, and second hosts that do not regard the memory performance relatively as important, and If the number of requests from the first hosts for a predetermined time is a third threshold value or more, the workload monitoring unit may determine that the workload is high, and, otherwise, the workload monitoring unit may determine that the workload is low.

The first hosts may include at least one or more of a CPU (Central Processing Unit) and a GPU (Graphic Processing Unit), and the second hosts may include at least one or more of a communication unit, a display controller and a video codec.

According to various embodiments, current consumption due to a refresh operation can be minimized without a reduction in performance of a memory system.

DETAILED DESCRIPTION

Various embodiments will be described below in more detail with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "Including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the present specification and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" Includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the present specification and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

In the following examples, an all-bank refresh operation and a per-bank refresh operation will be described.

During an all-bank refresh operation, all banks in a memory device are refreshed and thus the memory device cannot perform an operation other than the refresh operation. Therefore, the performance of the memory device may be reduced.

During a per-bank refresh operation, only one bank in a memory device is refreshed at any particular time and thus it is possible to access the other banks in the memory device at the same time. In this way, according to a per-bank refresh operation, a reduction in performance of the memory device due to the refresh operation is prevented. For refreshing all the memory banks in the memory device, the per-bank refresh operation is performed 'n' number of times, wherein 'n' is the number of the memory banks in the memory device. This is to be contrasted to an all-bank refresh operation, wherein the refresh operation is performed only once at the same time for all the banks of the memory device. For example, in a case where the memory device includes sixteen memory banks, during an all-bank refresh operation, sixteen memory banks are refreshed at a time, whereas for a per-bank refresh operation, one memory bank is refreshed at a time, and the per-bank refresh operation is performed sixteen times for refreshing all sixteen memory banks. Hence in this example the per-bank refresh operation is performed sixteen times more than the all-bank refresh operation. Therefore, the per-bank refresh operation may cause relatively greater current consumption than a multi-bank refresh operation (e.g., the all-bank refresh operation) for refreshing all the memory banks in the memory device.

That is, the all-bank refresh operation reduces the performance of the memory device, but has an advantage of small current consumption while the per-bank refresh operation is able to prevent the performance reduction of the memory device but has a disadvantage of greater current consumption.

Figure 1:
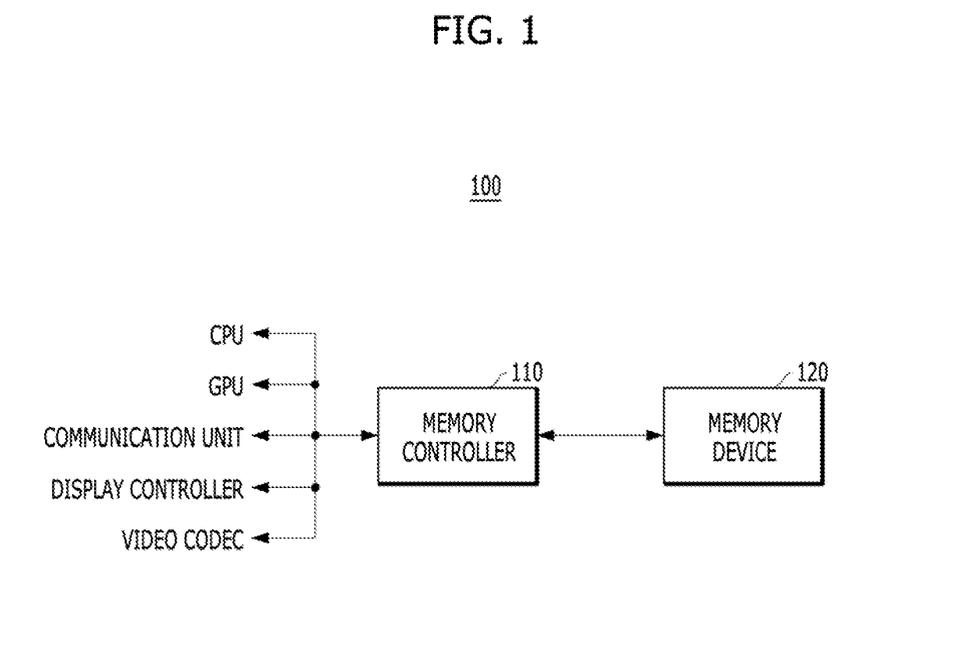
FIG. 1 is a schematic diagram illustrating a configuration of a memory system, according to an embodiment of the present invention.

Referring to FIG. 1, a configuration of a memory system 100 is provided, according to an embodiment of the present invention.

According to the embodiment of FIG. 1, the memory system 100 may include a memory controller 110 and a memory device 120 operatively coupled to one another. The memory system 100 may be part of a larger electronic device. The electronic device may be a portable electronic device. The electronic device may be a desk top electronic device. For example, the memory system 100 may be included in an electronic device, such as a computer, a server, a Personal Digital Assistant (PDA), a portable computer, a web tablet, a wireless phone, a mobile phone, a smart phone, a digital music player, a portable multimedia player (PMP), a camera, a Global Positioning System (GPS), a video camera, a voice recorder, telematics, an Audio Visual (AV) system, a smart television, and the like.

The memory device 120 may include a plurality of memory banks. In operation, the memory device 120 may receive a command and an address from the memory controller 110 and exchange data with the memory controller 110. The memory device 120 may perform at least one of a read, write and refresh operations, according to control of the memory controller 110.

The memory controller 110 may control operation of the memory device 120 according to a request from a host, such as, for example, a Central Processing Unit (CPU), a Graphic Processing Unit (GPU), a communication unit, a display controller, a video codec, and the like. The communication unit may be provided in a computer, a smart phone or the like so as to wirelessly exchange data with an external device. The display controller may be a controller which controls a display of a device included in the memory system 100. The video codec may be configured to encode or decode videos.

The memory controller 110 may monitor the workload of the memory device 120 and control a refresh operation according to a result of the workload monitoring. For example, when it is determined that the workload of the memory device is heavy, the memory controller 110 may apply a first refresh command to the memory device 120. When it is determined that the workload of the memory device 120 is light, the memory controller 110 may apply a second refresh command to the memory device 120. In the memory device 120, the number of memory banks to be refreshed by the single second refresh command may be greater than the number of memory banks to be refreshed by the single first refresh command. For example, the first refresh command may be a refresh command instructing a per-bank refresh operation and the second refresh command may be a refresh command instructing an all-bank refresh operation.

During a first refresh operation, according to a first refresh command, current consumption is higher than for a second refresh operation according to a second refresh command, however a reduction in the performance of the memory device 120 is substantially prevented. During a second refresh operation, according to a second refresh command, current consumption is reduced, however, the performance of the memory device is also substantially reduced. The memory controller 110 may provide the memory device 120 with a first refresh command for preventing a substantial performance reduction of the memory device 120 during a time period of heavy workload of the memory device 120. The memory controller 110 may provide the memory device 120 with a second refresh command for achieving a substantial reduction in the current consumption of the memory device 120 during a time period of light workload of the memory device 120.

Figure 2:
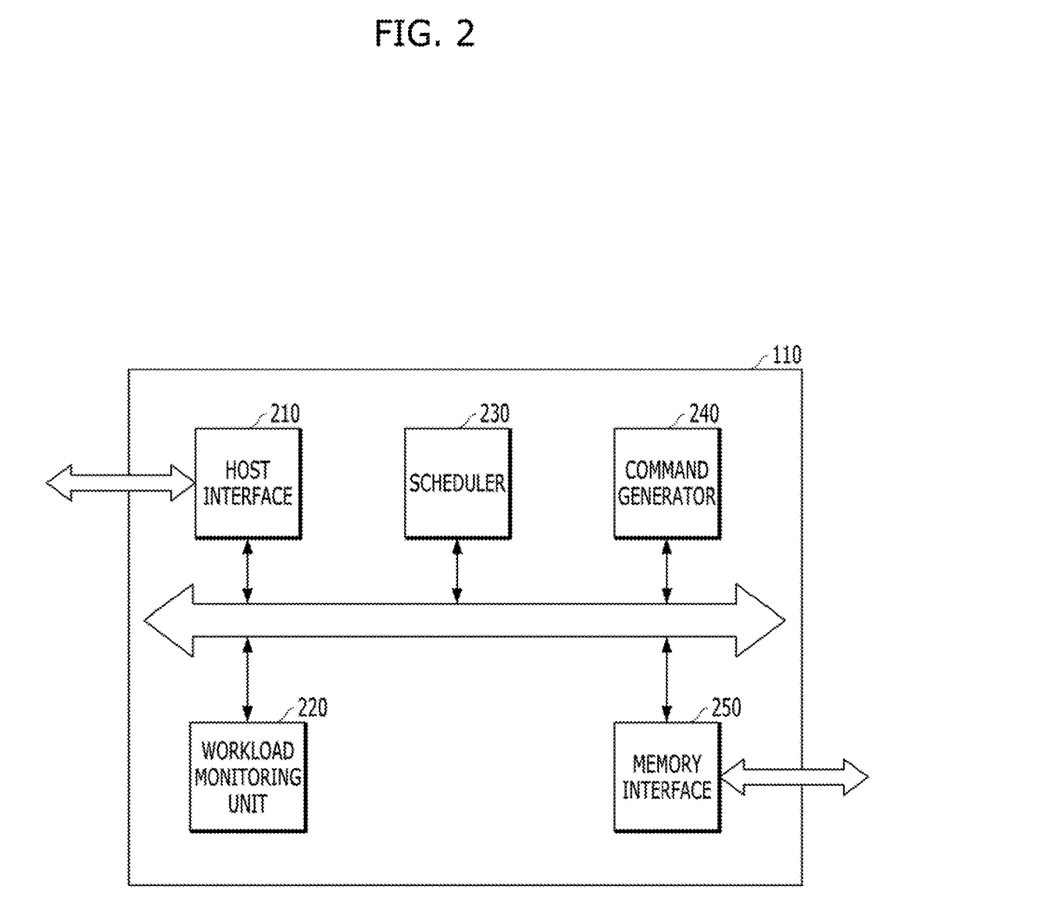
FIG. 2 is a schematic diagram illustrating a configuration of an embodiment of a memory controller of FIG. 1.

Referring now to FIG. 2, a schematic diagram illustrating a configuration the memory controller 110 of FIG. 1 is provided, according to an embodiment of the invention.

According to the embodiment of FIG. 2, the memory controller 110 may include a host interface 210, a workload monitoring unit 220, a scheduler 230, a command generator 240, and a memory interface 250, all being electrically coupled with an internal bus.

The host interface 210 may be any suitable interface for operatively coupling the memory controller 110 with at least one host.

Requests may be provided from the host through the host interface 210, and results of processing the requests may be transmitted to at least one host through the host interface 210. As described above, examples of a host may include a CPU, a GPU, a communication unit, a display controller, a video codec, and the like.

The workload monitoring unit 220 may be any suitable unit for monitoring the workload of the memory device 120. The workload monitoring unit 220 may monitor the workload of the memory device 120 periodically. For example, the workload monitoring unit 220 may periodically count the number of requests provided from at least one host during a predetermined time interval and determine whether the workload of the memory device 220 is heavy or light, for example, based on whether or not the number of requests is equal to or greater than a preset value. More detailed description pertaining to a workload determination method will be described later herein.

The scheduler 230 may determine an operation order for the requests to the memory device 120 for enhancing the performance of the memory device 120. The scheduler 230 may determine an operation order for the requests to the memory device 120, which may be different to a provision order of the requests from the host. For example, even if the CPU provides a read request to the memory device 120 before the GPU provides a write request to the memory device 210, the scheduler 230 may determine the operation order for the read and write requests such that the write operation requested by the GPU is performed prior to the read operation requested by the CPU.

The command generator 240 may generate a command to be applied to the memory device 20 according to an operation order determined by the scheduler 230. To prevent data loss of the memory device 120, the command generator 240 may periodically generate a refresh command. The command generator 240 may generate a first refresh command when the workload monitoring unit 220 determines the workload of the memory device 120 as being heavy, and may generate a second refresh command when the workload monitoring unit 220 determines the workload of the memory device 120 as being light.

The memory interface 250 may provide an interface between the memory controller 110 and the memory device 120. Any suitable interface may be employed. In operation, a command and an address may be transmitted from the memory controller 110 to the memory device 120 through the memory interface 250. Data may also be exchanged between the memory device 120 and the memory controller 110 through the memory interface 250. The memory interface 250 may also be called a PHY (Physical) interface.

Hereinafter, an operation of the workload monitoring unit 220 will be described in detail.

The workload monitoring unit 220 may periodically count the numbers of requests provided from at least one host during a predetermined time interval. Since each of the requests includes source information indicating the host that provides the request, it is possible to count the numbers of requests provided from each host when a plurality of hosts are employed.

When more than one hosts are employed, the plurality of hosts may be classified into first hosts requesting performance-sensitive operation, and second hosts requesting operations other than the performance-sensitive operation. For example, since a CPU and a GPU frequently have heavy workloads and thus request performance-sensitive operations, they may be classified as the first hosts. Since a communication unit, a display controller and a video codec frequently have light workloads and thus they request operations other than performance-sensitive operations, they may be classified as the second hosts.

In an embodiment, the workload monitoring unit 220 may determine the workload of the memory device 120 based on one of the following exemplary three criteria. We note, however, that other criteria for determination of the heavy or light workload may also be employed.

Workload Determination First Criterion: Total Number of Requests

Figure 3:
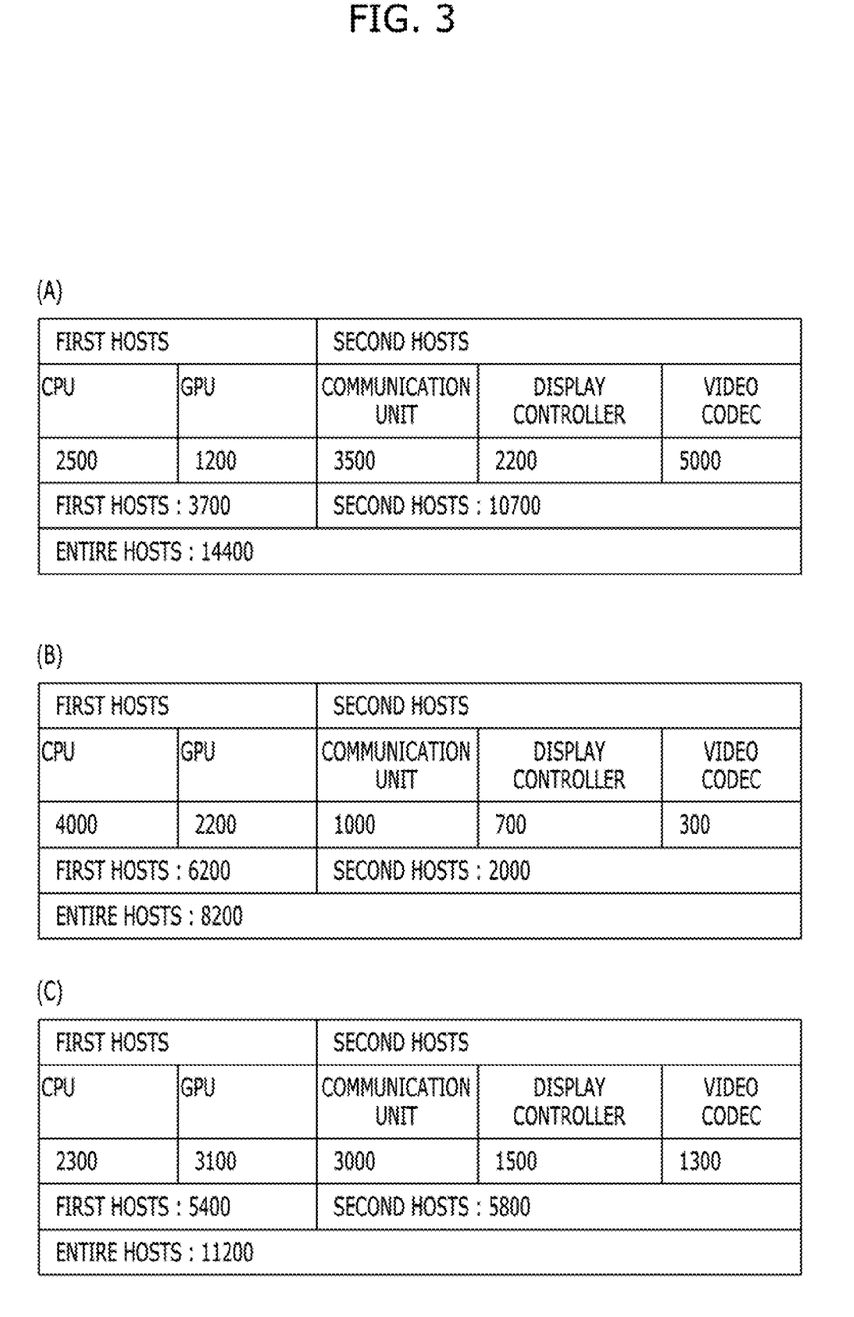
FIG. 3 is a schematic diagram illustrating examples of the number of requests counted by a workload monitoring unit for a predetermined time, according to an embodiment of the present invention.

If the total number of requests from at least one host during a predetermined time period is equal to or greater than a first threshold value, the workload monitoring unit 220 may determine that the workload of the memory device 120 is heavy. Otherwise, the workload monitoring unit 220 may determine that the workload of the memory device 120 is light. For example, if the total number of requests from at least one host for a predetermined time is 10,000 or more, it may be determined that the workload is heavy. Otherwise, it may be determined that the workload is light. In cases shown in parts (A) and (C) of FIG. 3, since the respective total numbers (i.e., the total numbers 14,400 and 11,200) of requests is greater than 10,000, it may be determined that the workload is heavy. In the case shown in part (B) of FIG. 3, since the total number (i.e., the total numbers 8,200) of requests is less than 10,000, it may be determined that the workload is light. Consequently, in the cases (A) and (C) of FIG. 3, the first refresh command may be applied from the memory controller 110 to the memory device 120. In the case (B) of FIG. 3, the second refresh command may be applied from the memory controller 110 to the memory device 120.

Workload Determination Second Criterion: Ratio of the Requests from the First Hosts Over the Requests from the Second Hosts If a ratio of requests from the first hosts over the requests from the second hosts during a predetermined time is equal to or greater than a second threshold value, the workload monitoring unit 220 may determine that the workload of the memory device 120 is heavy. Otherwise, the workload monitoring unit 220 may determine that the workload of the memory device 120 is light. This is to determine that, when many requests that are sensitive to the performance are present among all of the requests, the workload is heavy. For instance, if the ratio of requests from the first hosts over the requests from the second hosts during a predetermined time is 1.5 or more, it may be determined that the workload of the memory device 120 is heavy. Otherwise, it may be determined that the workload is light. In the case (B) of FIG. 3, since the ratio of requests from the first hosts over the requests from the second hosts is 3.1 (6200:20000), i.e., greater than 1.5, it is determined that the workload of the memory device 120 is heavy. In the cases (A) and (C) of FIG. 3, since the ratios of requests from the first hosts over the requests from the second hosts are respectively 0.3 and 0.9, which are less than 1.5, it may be determined that the workload is light. Consequently, in the case (B) of FIG. 3, the first refresh command may be applied from the memory controller 110 to the memory device 120. In the cases (A) and (C) of FIG. 3, the second refresh command may be applied from the memory controller 110 to the memory device 120.

Workload Determination Third Criterion: Number of Requests from First Hosts

If the number of requests from the first hosts for a predetermined time is a third threshold value or more, the workload monitoring unit 220 may determine that the workload of the memory device 120 is heavy. Otherwise, the workload monitoring unit 220 may determine that the workload of the memory device 120 is light. In this case, it is assumed that the performance-sensitive operation corresponding to the requests from the first hosts mainly affect the workload, the number of requests from the first hosts is mainly taken into account. For instance, if the number of requests from the first hosts for a predetermined time is 5,000 or more, it may be determined that the workload of the memory device 120 is heavy. Otherwise, it may be determined that the workload is light. According to this criterion, in cases (B) and (C) of FIG. 3, in which the requests from the first hosts are respectively 8,200 and 5,400, it may be determined that the workload of the memory device 120 is heavy while in case (A) of FIG. 3, in which the requests from the first hosts are 3,700, it may be determined that the workload of the memory device 120 is light.

Although various embodiments have been described for illustrative purposes, it will be apparent to those skilled in the art that various changes and modifications may be made without departing from the spirit and scope of the disclosure as defined in the following claims.

What is claimed is:

1. A memory system comprising:
   a memory device including a plurality of memory banks; and
   a memory controller suitable for monitoring a workload of the memory device, and applying one of a per-bank refresh command and an all-bank refresh command to the memory device according to a result of the monitoring,
   wherein only one bank of the memory device is refreshed when the per-bank refresh command is applied to the memory device and all banks of the memory device are refreshed when the all-bank refresh command is applied to the memory device,
   wherein the memory controller applies the per-bank refresh command to the memory device when the workload is heavy, whereas the memory controller applies the all-bank refresh command to the memory device when the workload is light, and
   wherein the memory controller comprises:
   a workload monitoring unit suitable for monitoring the workload of the memory device;
   a scheduler suitable for determining an operation order of the memory device based on a provision order of requests provided from one or more hosts, wherein the operation order is different from the provision order of requests provided from the one or more hosts so that when a first-requesting-host provides a read request to the memory device before a second-requesting-host provides a write request to the memory device, the scheduler determines the operation order to be that the write request from the second-requesting-host is performed prior to the read request from the first-requesting-host; and
   a command generator suitable for generating a command to be applied to the memory device according to the determined operation order.

2. The memory system according to claim 1, wherein the workload monitoring unit counts a number of the requests, and determines the workload of the memory device using a result of the counting.

3. The memory system according to claim 2, wherein, if a total number of the requests for a predetermined time is equal to or greater than a first threshold value, the workload monitoring unit determines the workload as being heavy, and, otherwise, the workload monitoring unit determines the workload as being light.

4. The memory system according to claim 2,
   wherein the one or more hosts are classified into first hosts providing performance-sensitive requests, and second hosts providing requests other than the performance-sensitive requests, and
   wherein, if a ratio of a number of requests from the first hosts over a number of requests from the second hosts for a predetermined time is equal to or greater than a second threshold value, the workload monitoring unit determines the workload as being heavy, and, otherwise, the workload monitoring unit determines the workload as being light.

5. The memory system according to claim 4,
   wherein the first hosts include at least one or more of a central processing unit (CPU) and a graphic processing unit (GPU), and
   wherein the second hosts include one or more of a communication unit, a display controller and a video codec.

6. The memory system according to claim 2,
   wherein the one or more hosts are classified into first hosts providing performance-sensitive requests, and second hosts providing requests other than the performance-sensitive requests, and
   wherein, if a number of requests from the first hosts for a predetermined time is a third threshold value or more, the workload monitoring unit determines the workload as being heavy, and, otherwise, the workload monitoring unit determines the workload as being light.

7. The memory system according to claim 1, wherein the first-requesting-host is a central processing unit (CPU) and the second-requesting-host is a graphic processing unit (GPU).

8. A memory controller comprising:
   a workload monitoring unit suitable for monitoring a workload of a memory device;
   a scheduler suitable for determining an operation order of the memory device based on a provision order of requests provided from one or more hosts, wherein the operation order is different from the provision order of requests provided from the one or more hosts so that when a first-requesting-host provides a read request to the memory device before a second-requesting-host provides a write request to the memory device, the scheduler determines the operation order to be that the write request from the second-requesting-host is performed prior to the read request from the first-requesting-host; and a command generator suitable for generating a command to be applied to the memory device according to the determined operation order, wherein the command generator generates one of a per-bank refresh command and an all-bank refresh command depending on the workload monitored by the workload monitoring unit, wherein only one bank of the memory device is refreshed when the per-bank refresh command is applied to the memory device and all banks of the memory device are refreshed when the all-bank refresh command is applied to the memory device, wherein, in the case where the workload is heavy, the command generator generates the per-bank refresh command, and wherein, in the case where the workload is light, the command generator generates the all-bank refresh command.

9. The memory controller according to claim 8, wherein the workload monitoring unit counts a number of the requests, and determines the workload of the memory device using a result of the counting.

10. The memory controller according to claim 9, wherein, if a total number of the requests for a predetermined time is equal to or greater than a first threshold value, the workload monitoring unit determines the workload as being heavy, and, otherwise, the workload monitoring unit determines the workload as being light.

11. The memory controller according to claim 9, wherein the one or more hosts are classified into first hosts providing performance-sensitive requests, and second hosts providing requests other than the performance-sensitive requests, and wherein, if a ratio of a number of requests from the first hosts over a number of requests from the second hosts for a predetermined time is equal to or greater than a second threshold value, the workload monitoring unit determines the workload as being heavy, and, otherwise, the workload monitoring unit determines the workload as being light.

12. The memory controller according to claim 11, wherein the first hosts include at least one or more of a central processing unit (CPU) and a graphic processing unit (GPU), and wherein the second hosts include one or more of a communication unit, a display controller and a video codec.

13. The memory controller according to claim 9, wherein the one or more hosts are classified into first hosts providing performance-sensitive requests, and second hosts providing requests other than the performance-sensitive requests, and wherein, if a number of requests from the first hosts for a predetermined time is a third threshold value or more, the workload monitoring unit determines the workload as being heavy, and, otherwise, the workload monitoring unit determines the workload as being light.

14. The memory controller according to claim 8, wherein the first-requesting-host is a central processing unit (CPU) and the second-requesting-host is a graphic processing unit (GPU).

* * * * *